United States Patent
Konecni et al.

(10) Patent No.: US 8,252,699 B2
(45) Date of Patent: Aug. 28, 2012

(54) COMPOSITE REMOVABLE HARDMASK

(75) Inventors: Anthony Konecni, Boise, ID (US);
Josephine Juhwei Liu, Boise, ID (US);
Deenesh Padhi, Sunnyvale, CA (US);
Bok Hoen Kim, San Jose, CA (US);
William H. McClintock, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/952,024

(22) Filed: Nov. 22, 2010

(65) Prior Publication Data
US 2012/0129351 A1    May 24, 2012

(51) Int. Cl.
*H01L 21/033*    (2006.01)
(52) U.S. Cl. ............... 438/763; 257/E21.035; 427/577
(58) Field of Classification Search ........... 257/E21.035; 427/577, 906; 438/703, 761, 763
See application file for complete search history.

(56) References Cited

U.S. PATENT DOCUMENTS

| | | | |
|---|---|---|---|
| 6,764,947 | B1 | 7/2004 | Chan et al. |
| 6,764,949 | B2 * | 7/2004 | Bonser et al. ............... 438/666 |
| 7,084,071 | B1 | 8/2006 | Dakshina-Murthy et al. |
| 7,368,440 | B2 | 5/2008 | Cassatt et al. |
| 7,378,350 | B2 | 5/2008 | Dalton et al. |
| 7,602,032 | B2 | 10/2009 | Klostermann et al. |
| 7,807,064 | B2 | 10/2010 | Kim et al. |
| 2003/0008490 | A1 | 1/2003 | Xing et al. |
| 2010/0093187 | A1 * | 4/2010 | Lee et al. ............... 438/780 |
| 2010/0189923 | A1 | 7/2010 | Goundar |

* cited by examiner

*Primary Examiner* — Julio J Maldonado
*Assistant Examiner* — Daniel Shook
(74) *Attorney, Agent, or Firm* — Patterson & Sheridan, LLP

(57) ABSTRACT

A method and apparatus for forming an amorphous carbon layer on a substrate is provided. A first portion of the amorphous carbon layer having a high stress level is formed from a hydrocarbon precursor having high dilution ratio, with optional amine precursor included to add stress-elevating nitrogen. A second portion of the amorphous carbon layer having a low stress level is formed on the first portion by reducing the dilution ratio of the hydrocarbon precursor and lowering or eliminating the amine gas. Pressure, temperature, and RF power input may be adjusted instead of, or in addition to, precursor flow rates, and different precursors may be used for different stress levels.

19 Claims, 2 Drawing Sheets

COMPOSITE REMOVABLE HARDMASK

FIELD

Embodiments described herein generally relate to methods of forming a semiconductor device. More specifically, embodiments described herein relate to methods of forming an etch mask layer in a semiconductor device manufacturing process.

BACKGROUND

The size of devices on semiconductor chips has decreased according to Moore's Law for more than 50 years. As features grow smaller, aspect ratios increase and device designs become more complex, new challenges arise in manufacturing such devices.

In recent years, there has been a shift toward the use of removable hardmask layers below resist films for patterning and etching of semiconductor substrates. Removable hardmasks offer advantages in reducing stack height and improving electrical properties of the final device, but as devices continue to shrink, residual stress engineered into hardmask layers to improve etch selectivity causes bending and weaving of pattern lines, line roughness, space width roughness, and general distortion of the etched pattern. In smaller features, such distortion increasingly causes device failure. Moreover, in some cases, residual stress in the hardmask layer causes problems with delamination during processing.

Thus, there is a continuing need for methods of etching fine patterns with minimal distortion in substrates for various applications in the semiconductor industry.

SUMMARY

Pattern line width roughness or space width roughness in an etched removable hardmask layer can be reduced by forming the hardmask layer with a low stress portion that reduces the pattern distortion created by internal stresses.

Methods of forming a hardmask layer on a substrate may be used that include forming a first layer consisting essentially of carbon and hydrogen having a first stress level on the substrate, and forming a second layer consisting essentially of carbon and hydrogen on the first layer, the second layer having a second stress level less than the first stress level.

Other methods include disposing a substrate in a process chamber and depositing a high stress material on the substrate. A precursor gas mixture consisting essentially of a hydrocarbon gas, an amine gas, and an inert gas flows into the process chamber, and chamber pressure, temperature, and RF power input are set to deposit the high stress material. A low stress material is deposited on the high stress material. Flow rate of the inert gas is decreased, and chamber pressure, temperature, and RF power input are set to deposit the low stress material.

Other methods form a hardmask layer and a pattern smoothing layer on the substrate. A hardmask layer consisting essentially of carbon, hydrogen, and nitrogen is formed on the substrate. A pattern smoothing layer consisting essentially of carbon and hydrogen is formed on the hardmask layer. A patterned resist layer may then be formed on the pattern smoothing layer, and the pattern smoothing layer and the hardmask layer may be etched using the patterned resist layer as a mask.

Other methods form an amorphous carbon layer having high compressive stress on a substrate and then reduce the compressive stress. A substrate is disposed in a processing chamber, and a precursor gas mixture comprising a hydrocarbon gas, an amine gas, and an inert gas is provided to the processing chamber. RF power forms a plasma from the precursor gas mixture to deposit the amorphous carbon layer having high compressive stress. The plasma is continued while a flow rate of the amine gas and a flow rate of the inert gas is ramped downward to reduce the compressive stress of the amorphous carbon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein provide methods of forming a patterning layer having good etch selectivity and low patterning distortion due to space width roughness. In general, patterning layers described herein have a high stress, high density portion for good etch selectivity to serve as an etch mask layer, and a portion having a different stress level that stabilizes pattern distortions arising from the high internal stresses of the etch mask layer. Some patterning layers described herein have a high stress portion and a low stress portion, the low stress portion tending to stabilize a pattern formed in the high stress portion. At the 20 nm node, space width roughness in a preferred embodiment averages less than 4 nm while maintaining etch selectivity and providing a useful mask thickness. The patterning layer may be a hardmask layer, may comprise a hardmask or etch mask layer and a pattern smoothing or stabilization layer, or may have a graded stress level.

Figure 1:
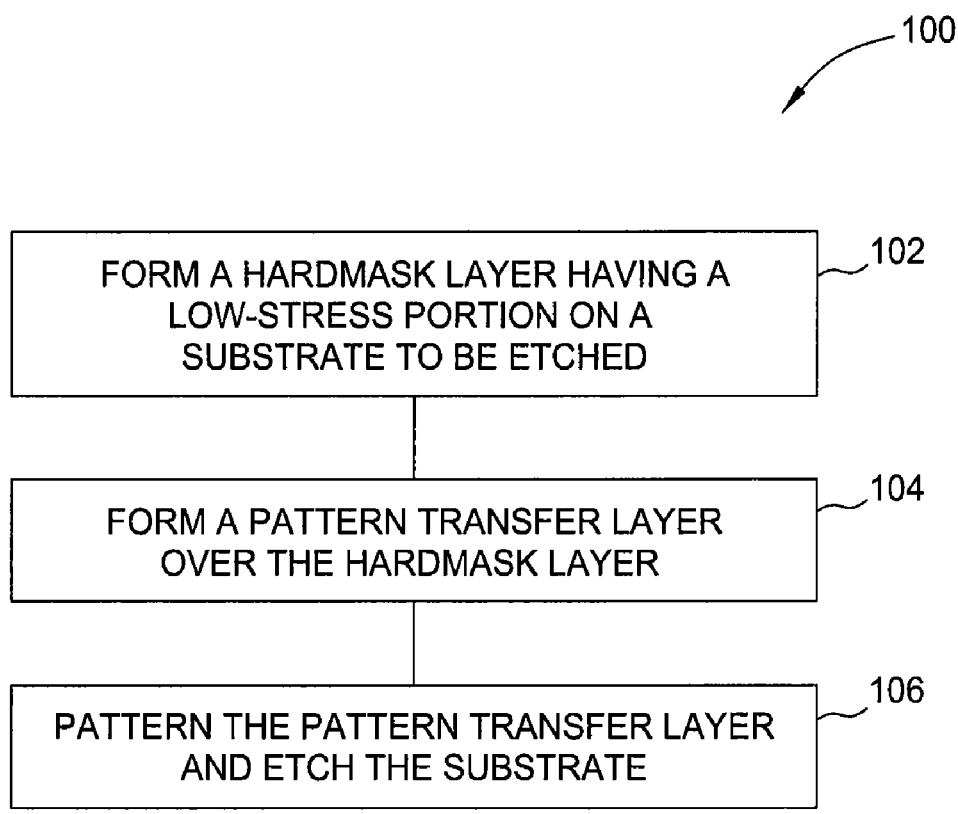
FIG. 1 is a flow diagram summarizing a method according to one embodiment.

FIG. 1 is a flow diagram summarizing a method 100 according to one embodiment. At 102, a hardmask layer is formed on a substrate to be etched, the hardmask layer comprising a high stress layer and a low stress layer. As such, the hardmask layer comprises a first layer having a first stress level and a second layer having a second stress level less than the first stress level. At 104, a pattern transfer layer is formed on the hardmask layer. At 106, the pattern transfer layer is patterned, and the pattern transferred through the hardmask layer into the substrate using the pattern transfer layer as a mask.

The hardmask layer of 102 is a removable hardmask layer, and is generally formed as an amorphous carbon layer in a CVD process from hydrocarbon precursors. The precursors, which may be mixed with one or more carrier gases, are flowed into a processing chamber containing one or more substrates. Energy is generally added to the gas mixture by thermal or electromagnetic means, such as RF, to speed reaction of the precursors to deposit the amorphous carbon layer.

Nitrogen containing precursors such as amines may also be included in part or all of the layer to adjust the stress level of the layer, or portions thereof. Adding nitrogen to amorphous carbon directionally increases internal compressive stress.

The hardmask layer may also be deposited at different conditions using different precursors and/or reaction conditions to adjust the stress level of the deposited layer. By adjusting chamber pressure, temperature, precursor flow rates, and RF power input level, two layers having substantially different stress levels may be deposited. Not to be bound by theory, it is thought that when a low stress layer is formed over a high stress layer, the low stress layer reduces the tendency of the stresses in the hardmask layer to distort the layer after patterning. Carbon atoms in the low stress layer bond to carbon atoms in the high stress layer and restrain the tendency of the high stress carbon matrix to deform. The low stress material pulls the high stress material back toward its original configuration with a restraining force that counteracts the compressive force tending to push atoms from the high stress material into a deformed configuration, reducing the pattern distortion arising from the compressive stress. It should be noted that the alternative configuration of a high stress layer over a low stress layer does not confer the same benefit because a photoresist layer that may be deposited over the high stress layer for patterning does not necessarily perform the same restraining function as a low stress material bonded to the high stress material. Additionally, the high stress layer is a foundation layer for the low stress layer. After etching, the high stress layer retains enough strength to support the low stress layer. If the high stress layer is formed over the low stress layer, the low stress layer does not provide the same benefit as a foundation layer.

The stress level of the hardmask layer may be adjusted by changing precursors, temperature, pressure, power input for ionizing processes, and ratio of precursors to carrier gases. In some embodiments, the low stress layer may have low magnitude tensile stress to counteract the effect of compressive stress in the high stress layer.

A hardmask layer having a high stress portion and a low stress portion may be formed in a PECVD process by positioning a substrate in a process chamber and providing a gas mixture comprising a hydrocarbon gas and an inert gas to the chamber. Suitable hydrocarbons have the general formula $C_xH_y$, where x is 2-4 and y is 2-10. Exemplary hydrocarbons include propylene ($C_3H_6$), propyne ($C_3H_4$), propane ($C_3H_8$), butane ($C_4H_{10}$), butylene ($C_4H_8$), butadiene ($C_4H_6$), and acetylene ($C_2H_2$), combinations of which may also be used. Suitable inert gases include argon and helium, which may also be combined. Low stress and high stress amorphous carbon layers may made using precursor that contain only carbon and hydrogen by varying deposition conditions to adjust the severity of ion bombardment during layer formation. Alternately, nitrogen containing precursors may be added to deposit nitrogen in the amorphous carbon layer. Adding nitrogen may increase the internal stress of the deposited layer.

In one example, a high stress amorphous carbon layer, or portion of an amorphous carbon layer, may be formed on a substrate by disposing the substrate in a process chamber and providing a mixture of acetylene ($C_2H_2$), trimethylamine ($N(CH_3)_3$), argon, and helium to the chamber. For a 300 mm substrate, the flow rate of acetylene is between about 400 and about 800 sccm, such as between about 500 and about 700 sccm, for example about 600 sccm. The flow rate of trimethylamine is between about 200 sccm and about 1,000 sccm, such as between about 300 sccm and about 700 sccm, for example about 500 sccm. The flow rate of argon is between about 10,000 sccm and about 20,000 sccm, such as between about 12,000 sccm and about 16,000 sccm, for example about 14,000 sccm. The flow rate of helium is between about 200 sccm and about 600 sccm, such as between about 300 sccm and about 500 sccm, for example about 400 sccm. High frequency RF power having a frequency of about 13.56 MHz is coupled into the chamber at a power level between about 100 W and about 3,000 W, such as between about 1,000 W and about 2,000 W, for example about 1,400 W. Deposition is continued under these conditions for a time necessary to deposit a film of desired thickness, such as between about 10 seconds and about 5 minutes, for example about 30 seconds. Chamber pressure is less than about 2 Torr, such as between about 1 mTorr and about 2 Torr, for example about 1 Torr, and temperature is between about 300° C. and about 650° C., for example about 480° C.

A low stress amorphous carbon layer, or portion of an amorphous carbon layer, which may be a pattern smoothing layer or a stabilization layer, may be formed on a substrate by disposing the substrate in a process chamber and providing a mixture of a hydrocarbon gas and an inert gas to the chamber. Any of the hydrocarbons listed above may be used to deposit a low stress amorphous carbon layer. For a 300 mm wafer, the hydrocarbon gas may be provided at flow rates similar to those described above for a low stress layer, and flow rates of inert gases such as argon and helium are typically between about 400 sccm and about 8,000 sccm, such as between about 500 sccm and about 5,000 sccm, for example about 1,000 sccm. Chamber pressure is maintained above about 2 Torr, such as between about 2 Torr and about 10 Torr, for example about 7 Torr. Temperature is similar to that for the low stress layer.

The low stress layer may also be formed using lower dilution and higher pressure, if desired. In forming the low stress layer, the precursor gas mixture typically has a volumetric flow ratio of inert gas to hydrocarbon gas between about 0.1:1 and about 10:1, such as between about 1:1 and about 5:1, for example about 2:1. At dilution ratios toward the upper end of the range, lowering deposition pressure below about 1 Torr, such as about 50 mTorr, also results in a low stress amorphous carbon layer. In forming the high stress layer, the precursor gas mixture typically has a higher dilution ratio. The volumetric flow ratio of inert gas to deposition gas, for example hydrocarbon and amine gas, is typically between about 10:1 and about 100:1, such as between about 12:1 and about 20:1, for example about 14:1, for depositing a high stress layer. The volumetric flow ratio of amine gas to hydrocarbon gas is typically between about 0.5:1 and about 2:1, for example about 1:1. The amine gas introduces nitrogen, which directionally increases the internal stress of the deposited layer.

A high stress amorphous carbon layer deposited under conditions described above usually has compressive stress greater than 600 MPa, such as greater than about 800 MPa, or between about 800 MPa and about 2,000 MPa, for example about 1,200 MPa. A low stress layer according to the embodiments described above usually has compressive stress less than about 600 MPa, such as less than about 400 MPa, and may display tensile stress up to about 200 MPa in some embodiments. The combination of high and low stress in the hardmask layer offers good etch selectivity to polysilicon and silicon nitride, low space width roughness of the pattern, and enough mask thickness to facilitate etching the substrate.

Figure 2A:
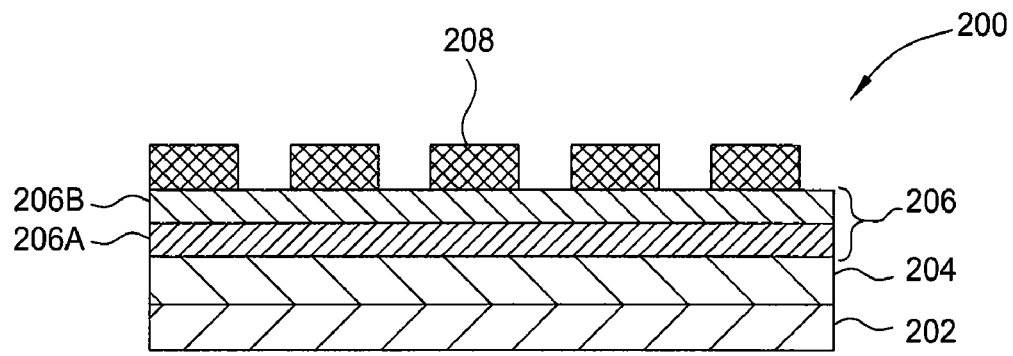
FIG. 2A is a schematic cross-sectional view of a device undergoing the method of FIG. 1 according to another embodiment.

FIG. 2A is a schematic cross-sectional view of a device 200 undergoing the method of FIG. 1 according to one embodiment. A semiconductor layer 202, for example silicon, has an oxide layer 204 formed thereon. A patterning layer 206 is formed on the oxide layer 204. The patterning layer 206 has a high stress portion 206A and a low stress portion 206B, as described in connection with FIG. 1. Each of the portions 206A/B is an amorphous carbon layer, and the high stress portion 206A may include a stress-increasing element such as nitrogen. Using the amine precursor described in the method 100 may result in a nitrogen concentration of between about 1 atomic percent and about 10 atomic percent. Other stress-increasing elements, such as silicon, may also be used.

The portions 206A/B are shown having approximately equal thickness in FIG. 2A. The thickness of the low stress portion 206B may be between about 10% and 150% of the thickness of the high stress portion, for example between about 25% and about 75%.

A patterned resist layer 208 is shown formed on the patterning layer 206. The resist layer 208 may be used as a mask to etch the patterning layer 206 and the subjacent oxide layer 204.

Figure 2B:
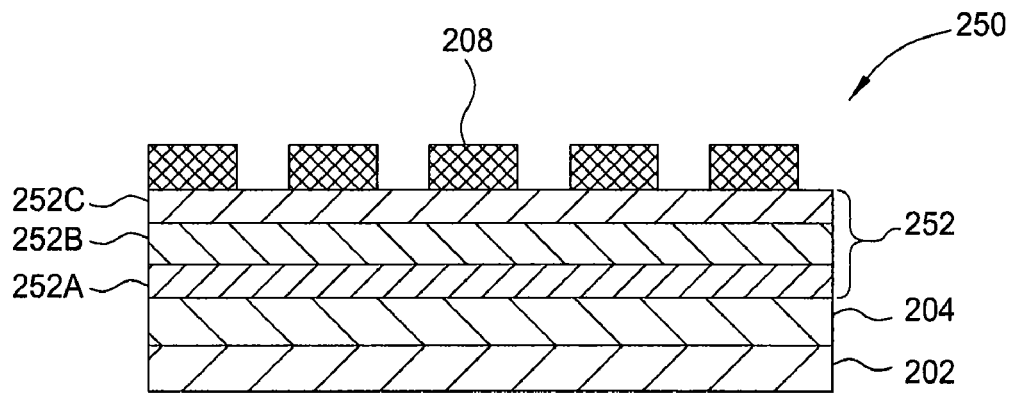
FIG. 2B is a schematic cross-sectional view of another device undergoing the method of FIG. 1 according to another embodiment.

FIG. 2B is a schematic cross-sectional view of another device 250 undergoing the method of FIG. 1 according to another embodiment. The device 250 of FIG. 2B differs from the device 200 of FIG. 2A in that a patterning layer 252 has three portions 252A/B/C having different stress levels. As described in connection with the method 100 of FIG. 1, the stress level of different portions of the patterning layer may be adjusted by changing deposition conditions and levels of co-deposited stress-increasing elements. For example, portion 252A may have nitrogen at a high concentration, while portion 252B has nitrogen at a low concentration and portion 252C has no nitrogen. Alternately, the three portions 252A/B/C may consist essentially of carbon and hydrogen deposited at different chamber conditions to induce different stress levels.

It should be noted that different hydrocarbon precursors used for deposition may also induce different stress levels in the deposited amorphous carbon layer. For example, under the same deposition conditions, linear hydrocarbons directionally produce higher stress than cyclic or aromatic hydrocarbons.

In another embodiment, a graded layer may be formed in which the level of internal stress decreases as the layer grows. It is generally preferred to form an amorphous carbon layer having a stress gradient that varies along the thickness of the layer. The stress may decrease from the bottom to the top of the layer, such that the stress varies smoothly from a high stress configuration near the bottom of the layer to a low stress configuration near the top of the layer.

Smooth variation in the stress level of different parts of the deposited layer may be achieved by ramping, or smoothly varying, precursor flows and/or deposition conditions. Chamber temperature and pressure, plasma power input may be ramped, linearly or non-linearly, for example according to a sigmoidal curve, from a first condition to a second condition, concurrently, simultaneously, or separately.

In one embodiment, a graded stress layer having a stress magnitude that decreases in the direction of growth of the layer may be formed by smoothly increasing the dilution ratio of the reaction mixture. The dilution ratio may be adjusted by any combination of increasing diluent flow and decreasing flow of a carbon source material. The flow rates of diluent gases and carbon source materials described above may serve as high and low stress end points for the programmed variation.

In one example, a 300 mm substrate may be disposed in a processing chamber and a precursor gas mixture supplied to the chamber. The precursor gas mixture may comprise about 600 sccm acetylene, about 500 sccm trimethylamine, about 14,000 sccm argon, and about 400 sccm helium, as described above for depositing a high stress amorphous carbon layer. Chamber pressure may be established at about 5.7 Torr and temperature at about 480° C. High-frequency RF power may be coupled to the gas mixture at a power level of about 1,400 W to deposit a high stress initiation layer.

After depositing the high stress initiation layer to a first thickness over a first duration, the flow rate of argon to the chamber may be smoothly decreased to about 600 sccm to create a decreasing stress gradient in the deposited film. The change rate and pattern is selected to complete the decrease during a second duration while depositing a second thickness of a transition layer having a decreasing stress gradient in the direction of film growth. In an optional concurrent or simultaneous operation, the flow rate of acetylene may be smoothly increased to about 800 sccm, and the flow rate of trimethylamine may be smoothly decreased to zero to further decrease the stress by elimination nitrogen from the gas mixture. Further, the chamber pressure may be smoothly increased to about 10 Torr to further decrease the stress. Additionally, different hydrocarbon precursors may be combined at desired stages to adjust stress level of the deposited amorphous carbon layer. For example, an aromatic precursor such as benzene or toluene may supplement acetylene, and may be smoothly increased from the high stress condition to the low stress condition.

After depositing the transition layer, a low stress layer may be deposited to a third thickness over a third duration. The first thickness is generally between about 30% and about 75% of the entire layer thickness (sum of first, second, and third thicknesses). The second thickness may be between about 20% and about 60% of the entire layer thickness. The third thickness may be between about 0% and about 50% of the entire layer thickness. An exemplary graded stress amorphous carbon layer 1 μm thick may thus have a high stress portion about 500 nm thick, a transition stress portion about 300 nm thick and a low stress portion about 200 nm thick.

During deposition, the first duration may be between about 10 seconds and about 60 seconds, the second duration may be between about 10 seconds and about 30 seconds, and the third duration may be between about 10 seconds and about 30 seconds. It should be noted that deposition rate is generally lower for low stress deposition conditions, so deposition duration reflects the desired thickness to be deposited at the different rates.

While the foregoing is directed to embodiments of the present invention, other and further embodiments of the invention may be devised without departing from the basic scope thereof, and the scope thereof is determined by the claims that follow.

The invention claimed is:

1. A method of forming a hardmask layer on a substrate, comprising:
    forming a first layer consisting essentially of carbon and hydrogen having a first stress level on the substrate; and
    forming a second layer consisting essentially of carbon and hydrogen on the first layer, the second layer having a second stress level less than the first stress level.

2. The method of claim 1, wherein the first and second layers are amorphous carbon layers.

3. The method of claim 1, wherein the second layer is thinner than the first layer.

4. The method of claim 1, wherein the first layer is formed from a first gas mixture comprising a first hydrocarbon and the second layer is formed from a second gas mixture comprising a second hydrocarbon different from the first hydrocarbon.

5. The method of claim 1, wherein the second layer is formed at a chamber pressure higher than the first layer.

6. The method of claim 1, wherein the first layer is formed from a first gas mixture comprising a hydrocarbon gas and an inert gas at a first volumetric ratio of inert gas to hydrocarbon gas, the second layer is formed from a second gas mixture comprising the hydrocarbon gas and the inert gas at a second volumetric ratio of inert gas to hydrocarbon gas, and the first volumetric ratio is at least about three times the second volumetric ratio.

7. The method of claim 1, wherein the first layer and the second layer are formed in one process chamber.

8. The method of claim 7, further comprising forming a transition layer between the first layer and the second layer, the transition layer having a stress level that varies smoothly between the first stress level and the second stress level.

9. A substrate processing method, comprising:
   disposing a substrate in a process chamber;
   flowing a precursor gas mixture consisting essentially of a hydrocarbon gas, an amine gas, and an inert gas into the process chamber;
   setting chamber pressure, temperature, and RF power input to deposit a high stress material from the precursor gas mixture; and
   decreasing a flow rate of the inert gas and setting chamber pressure, temperature, and RF power input to deposit a low stress material from the precursor gas mixture on the high stress material.

10. The method of claim 9, wherein the high stress material has a stress level with a first magnitude greater than about 600 MPa, and the low stress material has a stress level with a second magnitude not more than about 600 MPa.

11. The method of claim 10, wherein a ratio of the first magnitude to the second magnitude is at least about 2.0.

12. The method of claim 9, wherein a ratio of the amine gas volumetric flow rate to the hydrocarbon gas volumetric flow rate is between about 0.5:1 and about 2:1.

13. The method of claim 9, wherein the hydrocarbon gas and the amine gas together constitute a deposition precursor, and a ratio of the inert gas volumetric flow rate to the deposition precursor volumetric flow rate is between about 10:1 and about 100:1 while depositing the high stress material, and between about 1:1 and about 10:1 while depositing the low stress material.

14. The method of claim 13, wherein a ratio of the amine gas volumetric flow rate to the hydrocarbon gas volumetric flow rate is between about 0.5:1 and about 2:1.

15. A method of forming a patterning layer on a substrate, comprising:
   forming a hardmask layer consisting essentially of carbon, hydrogen, and nitrogen on the substrate;
   forming a pattern smoothing layer consisting essentially of carbon and hydrogen on the hardmask layer;
   forming a patterned resist layer on the pattern smoothing layer, wherein the patterned resist layer is in direct contact with the patterned smoothing layer; and
   etching the pattern smoothing layer and the hardmask layer using the patterned resist layer as a mask, wherein the hardmask layer has higher internal stress than the pattern smoothing layer.

16. The method of claim 15, wherein the hardmask layer has compressive stress of at least about 600 MPa and the pattern smoothing layer has compressive stress not more than about 600 MPa.

17. The method of claim 15, wherein the pattern smoothing layer has a thickness that is between about 25% and about 75% of a thickness of the hardmask layer.

18. The method of claim 15, wherein the hardmask layer has nitrogen concentration between about 1 atomic percent and about 10 atomic percent.

19. A method of forming an amorphous carbon layer on a substrate, comprising:
   disposing the substrate in a processing chamber;
   providing a precursor gas mixture comprising a hydrocarbon gas, an amine gas, and an inert gas to the processing chamber;
   applying RF power to the precursor gas mixture to form a plasma from the precursor gas mixture and deposit an amorphous carbon layer having high compressive stress on the substrate; and
   continuing the plasma while ramping a flow rate of the amine gas and a flow rate of the inert gas downward to reduce the compressive stress of the amorphous carbon layer.

\* \* \* \* \*